United States Patent [19]

Guo et al.

[11] Patent Number: 5,457,719

[45] Date of Patent: Oct. 10, 1995

[54] ALL DIGITAL ON-THE-FLY TIME DELAY CALIBRATOR

[75] Inventors: Bin Guo, Fremont; Jim Kubinec, Reno; Eugen Gershon, Los Gatos, all of Calif.

[73] Assignee: Advanced Micro Devices Inc., Sunnyvale, Calif.

[21] Appl. No.: 105,079

[22] Filed: Aug. 11, 1993

[51] Int. Cl.$^6$ ........................................ H03D 3/24
[52] U.S. Cl. .......................... 375/373; 375/232; 375/371; 375/375; 327/9; 327/2
[58] Field of Search .................... 307/590, 591, 307/595, 601, 602, 514, 516; 328/55, 56; 375/118, 119, 120, 14, 232, 371, 373, 375; 327/261, 263, 265, 400, 269, 3, 7, 9, 12

[56] References Cited

U.S. PATENT DOCUMENTS

| | | | |
|---|---|---|---|
| 5,036,528 | 7/1991 | Costantino et al. | 375/119 |
| 5,049,766 | 9/1991 | van Driest et al. | 328/55 |
| 5,138,635 | 8/1992 | Ballance | 375/119 |
| 5,245,231 | 9/1993 | Kocis et al. | 307/602 |
| 5,245,637 | 9/1993 | Gersbach et al. | 375/119 |
| 5,313,503 | 5/1994 | Jones et al. | 375/120 |

*Primary Examiner*—Stephen Chin
*Assistant Examiner*—Amanda T. Le
*Attorney, Agent, or Firm*—Gerald M. Fisher

[57] ABSTRACT

An on-chip digital servo scheme for providing continuous calibration of integrated circuit on-chip time delay devices to provide real-time regulation against various parameter or environmental changes, such as processing, temperature and power supply variations. The techniques are particularly useful for semiconductor delay lines comprised of a selectable number of identical unit delay circuits having the same propagation time. This scheme constantly monitors the delay changes in the unit delay elements and calibrates the delay line by comparing the delay against a stable, crystal controlled reference clock period to determine, in each instance, how many unit delay elements in the delay line is needed to effectively delay the amount of time to equal the reference clock period. A real time digital pointer number is generated and updated while the device is in operation. This pointer can be used to inform or update other delay or time bases on the same integrated circuit substrate which are constructed from the same type of unit delay cell and which may choose to use a different number of unit delay cells. Accordingly, this scheme can then be used for various delay regulation purposes in and all-digital circuit, such as clock multiplication, pulse width regulation, and other applications where accurate, regulated, digital command controlled delay or time bases are needed.

6 Claims, 6 Drawing Sheets

ALL DIGITAL ON-THE-FLY TIME DELAY CALIBRATOR

FIELD OF THE INVENTION

This invention relates to digital circuit time delay elements, and more specifically, to calibration methods and apparatus for such time delays.

BACKGROUND OF THE INVENTION

In data transmission and many analogue and digital systems, accurate and stable delay elements are often necessary for various purposes such as the generation of predetermined width pulses, clock synchronization, clock multiplication and clock/data recovery. In traditional phase locked loop (PLL) or other mixed analog-digital approaches, the clock rate of a controlled oscillator or the time delay value of a delay element can be obtained by applying an analog voltage or current as the control signal to its voltage controlled oscillator locked to a reference oscillator. This control signal is often a filtered or smoothed output from a phase detector, frequency range controller, a timing detection circuit, or a combined control signal from several detectors. The analog nature of the control signal enables a continuous, stepless tuning of the controlled frequency or time delay value, however, the high loop gain due to high frequency or high data rate operations, makes the operation very sensitive to noise. Performance optimization becomes difficult especially when integration with very large scale high speed digital functions is necessary, since digital switching operations tends to induce a large amount of switching noise.

An all-digital phase locked loop, based on use of time delay elements, can eliminate these concerns. By using a plurality of small delay elements in series to construct time delays, time delay values can be obtained having a "resolution" determined by the delay value of the individual element. The delay element could be a standard integrated circuit inverter device. However, the delay of the inverters are not fixed and will be variable due to process variations, temperature change, and power supply noise. Therefore, where a constant, accurate delay is required, such as in most of the precise applications mentioned above, the standard inverter is not adequate.

As CMOS and other processing technologies provide more density of devices, long strings of cascaded inverters of small delay can be obtained at lower and lower cost and the inverters can be used as the basic high resolution unit delay element. In addition, all-digital solutions are becoming attractive to replace many more applications which are implemented now in analog technique or mixed analog-digital schemes.

In applications where a plurality of unit delay cells are used to form various timing bases, a need exists for a general detection scheme which can provide the time delay value of the basic delay cell on-the-fly in a digital format, i.e., in real time, and which employs only standard logic cells such that it can be readily integrated with the digital functions that require accurate delay or delay regulation.

SUMMARY OF THE INVENTION

The object of this invention is to provide apparatus and methods to calibrate delay elements to compensate for parameter or operating condition variations and to provide the information to other circuit blocks that require delay regulation.

A principal objective of the present invention is to provide a digital scheme that detects the delay variations of the unit delay cells made in an integrated circuit and generates a digital number which represents the time delay value in real time. This data can then be used in various parts of the integrated circuit for controlling or selecting the proper number of unit delay cells to be cascaded, for the purpose of forming accurate time delay for timing purposes.

Another provision of the invention is an all digital scheme which employs only standard logic cells such that the function can be easily integrated into a digital design which can be designed and verified with standard logic verification tools.

In accordance with the principals of the invention, an all-digital real time delay detection and digital representation scheme is described for on-chip delay regulation of integrated circuits. The detection scheme primarily comprises: a delay line formed by cascaded unit delay cells from which phase shifted copies of a crystal reference clock are obtained; a phase comparator array formed by an array of simple exclusive OR (XOR) gates for phase comparison between each of the phase shifted copy and the original reference clock; a delta-phase window generation circuit which produces a "window" region consisting of several stages centered at the stage of the delay line where the reference clock is delayed by a time lapse which equals the reference clock period; and a delta-phase window detection block which detects the "address" of the two end locations of the delta-phase window region. The term "delta-phase" window region refers to the stages in the delay line from which the delayed or phase shifted copy of the crystal reference clock has a small phase difference with the original reference clock. A number representative of the average position of the window center is obtained. The two detected end address are added and the sum is divided by two to generate the address of the window center, or the zero-phase-address. This address or value represents the number of stages needed to delay the time lapse equal to the cycle or period time of the reference clock and will be accurate for all operating conditions. The window center address or the number of stages required are different for integrated circuits from different processing runs, and will vary during circuit operation due to temperature variation, power supply fluctuation and other noise sources which cause delay fluctuation of the unit delay cells. The output of the scheme is a digital number which can be used as the delay regulation information for other parts of any circuits on the same die. As an example, assuming that all the unit delay cell on the same circuit die have matched structure and therefore matched delay, when it is found that N is the number of unit delay cells required for delaying the time lapse equals to the period T of a reference clock running at frequency F, n unit delay cells could be used to delay a different time t. In the case of a ring oscillator constructed from n/2 cascaded unit delay cells, the oscillating frequency would be F multiplied by N/n, where N/n should be a positive number greater than one. Other applications include accurate delay elements for time-ruler operations or generation of pulses with predetermined constant width, where a ratio exists between the reference clock period and the required delay time. Various time scaling operations can be performed through a decoding circuit or a read only memory (ROM) in which scaling information is stored.

DETAILED DESCRIPTION

Figure 1:
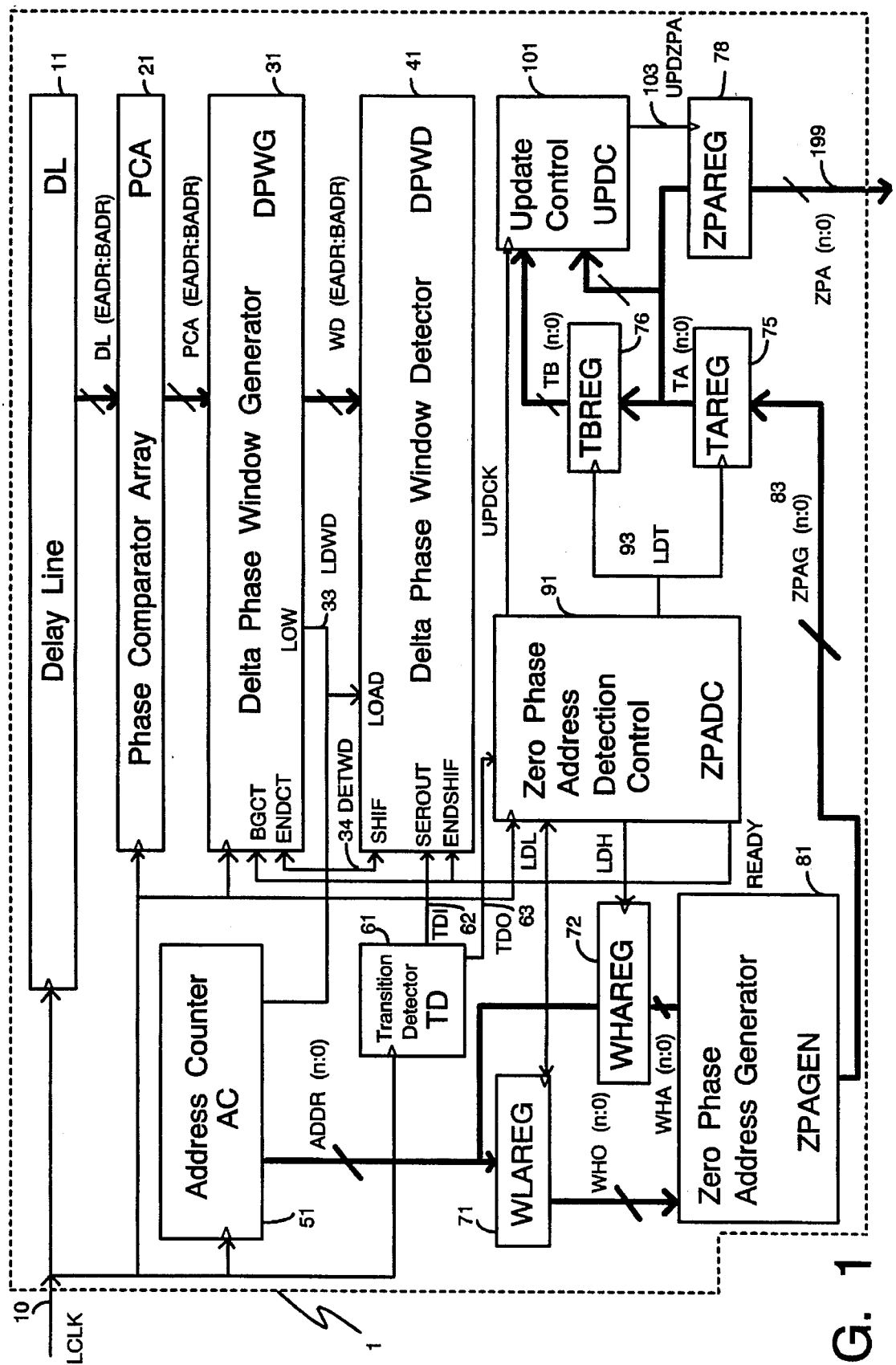
FIG. 1 illustrates, in block diagram form, an embodiment for performing the delay detection in an integrated circuit in accordance with the present invention.

In the block diagram shown in FIG. 1, the Local Clock 10 (LCLK) is the input signal to the calibrator 1. This reference signal is the basic timing reference for the operation. The output of the calibrator 1 is a digital word ZPA(n:0) 199 indicating the delay information in real time.

Figure 2:
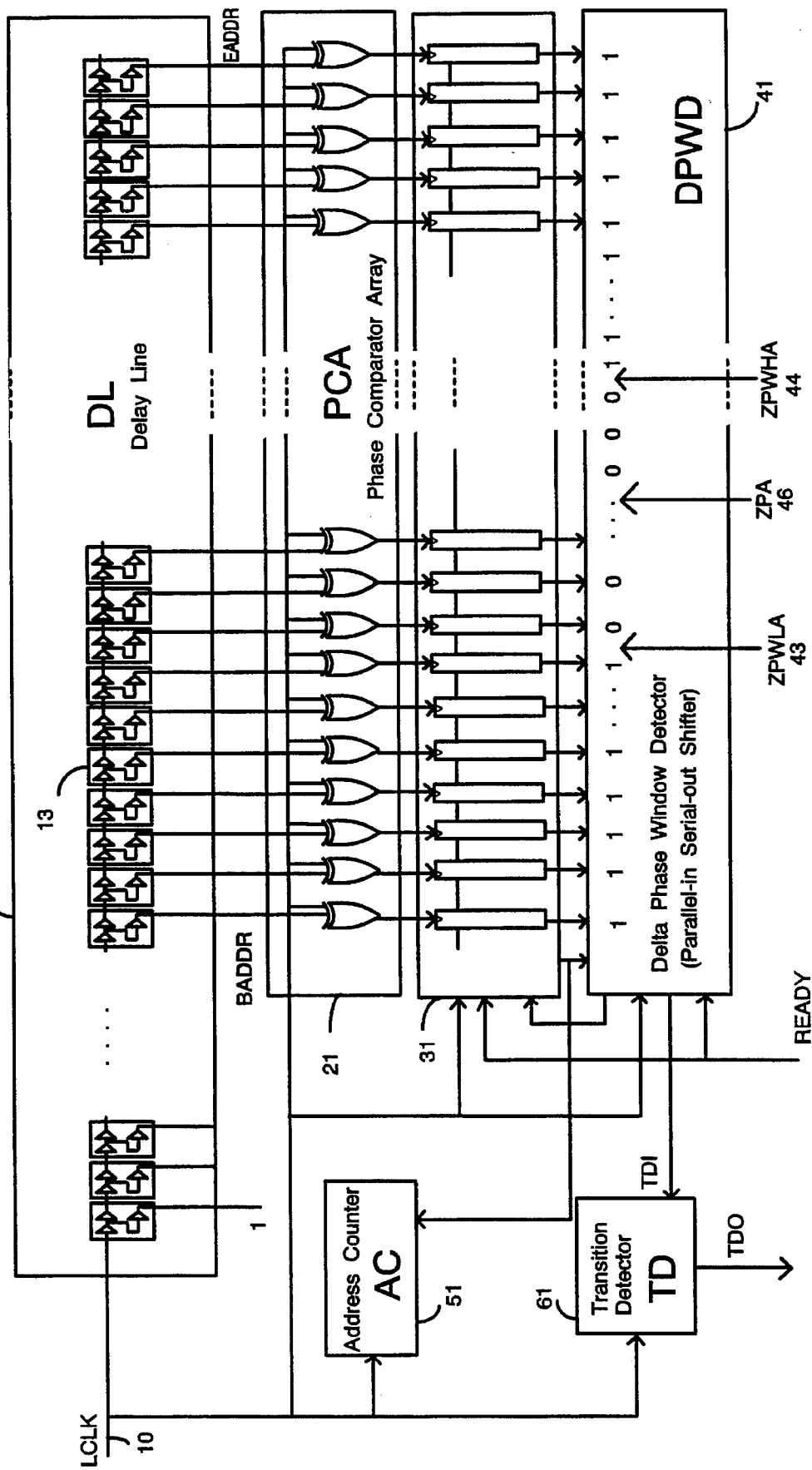
FIG. 2 is a block diagram with certain details showing the delay line, the phase comparator array, and the formation of the delta-phase window.

With reference to FIG. 2, the Delay Line (DL) 11 is seen to be constructed from a cascaded array of n unit delay cells 13, each of the unit delay cells is designated by an "address" corresponding to its physical location in the array. For example, the unit delay cell of the first stage in DL has the address of "1", cell of the last stage n has the address of EADDR (end address). The stage from which the phase comparator array 21 (PCA) starts to do the phase comparison has the address of BADDR (begin address). The selection of BADDR and EADDR relates to the delay value of the unit delay cell which is Tud and the reference clock has a period of Tref. The nominal EADDR or the total physically built cascaded unit delay cells is Nnom=Tref/Tud. However, the processing variation may cause the unit delay to vary in a range of Tud=±p %. Operating conditions can extend this range further. Also, the detection envisions use of a range of possible unit delays where the delay is close to 360 degrees, i.e., which is called a window. Accordingly, the delay line should have adequate number of unit delay cells to accommodate all possible delays adding simultaneously. The phase comparator array (PCA) 21 consists of a plurality of XOR gates equal to EADDR−BADDR, where each gate receives the reference clock LCLK 10 as one input, and one of the output taps from the unit delay stages in the window of DL 11 as the other input. In another word, the XOR's are the phase comparator of the reference clock LCLK and its phase shifted copies. Obviously circuits of other logic gates, OR, NOR, AND, NAND with inverters can be combined to provide the same function as the exclusive OR (XOR). The outputs from PCA 21 are each applied to a clock input of a sample and hold counter in the delta phase window generator (DPWG) 31, the outputs of which counters are directed to the inputs of the delta-phase window detector (DPWD) 41 which is essentially a parallel-in serial-out shifter. DPWD 41 samples the outputs of DPWG 31, and the pattern of "111 . . . 1100 . . . 0011 . . . 111" is expected as will be further explained with reference to FIG. 3. The stages in which the PCA output is zero are the "delta phase" addresses which means that the phase differences of the original LCLK and its delayed copy detected in these stages are in the neighborhood of zero. The address of the left side border of the "zero zone" indicated by an 1→0 transition is called delta phase window low address (DPWLA) 43, while the right side border of the zero zone indicated by a 0→1 transition is called delta phase window high address (DPWHA) 44. The center of this window region will be designated as the stage location where the reference clock is delayed exactly a full cycle such that the LCLK and its delayed copy have no phase difference. The address of the center stage is the so-called zero phase address (ZPA) 46. The detection of ZPA based on the detection of DPWLA and DPWHA is accomplished as follows: after the window pattern is sampled or parallel loaded into the shifter DPWD, the window data pattern is shifted left into a transition detector (TD) 61 while the synchronized address counter (AC) 51 starts counting the shift clock.

With reference to FIG. 1, when the first 1→0 transition is detected in TD 61, a pulse is output at TDO 63 which causes the zero phase address detection control (ZPADC) 91 to generate a signal LDL to latch the content of the address counter AC as the low address of the window into the window low address register (WLAREG) 71. Later, when another transition (0→1)is detected by TD 61, a pulse is again output of TDO 63 which causes the zero phase address detection control (ZPADC) 91 to generate a signal LDH to latch the content of the address counter AC as the high address of the window into the window high address register (WHAREG) 72. The two addresses are added in ZPAGEN 81 which is an (n+2) bit parallel adder. A simple shift operation of ZPAGEN performs the divide by 2 function. (The divide function is not actually necessary because the sum is representative of the coverage multiplied by a constant.) The result is a (n+1) bit binary number ZPAG(n:0) which represents the window center location or the zero phase address in the delay line 11 at that instant. This ZPAG data 83 is then latched into a temporary register (TAREG) 75 by control signal LDT 93 from ZPADC 91. To avoid noise interferences during the process of forming the zero phase window we provide, but our approach is not limited thereto, an update control block (UPDC) 101 to perform additional noise rejection by comparing the contents of TAREG and TBREG to find if the change in ZPAG value represents a steady delay shift or just a temporary fluctuation due to circuit noise. The data is loaded into the output register (ZPAREG) 78.

Figure 3:
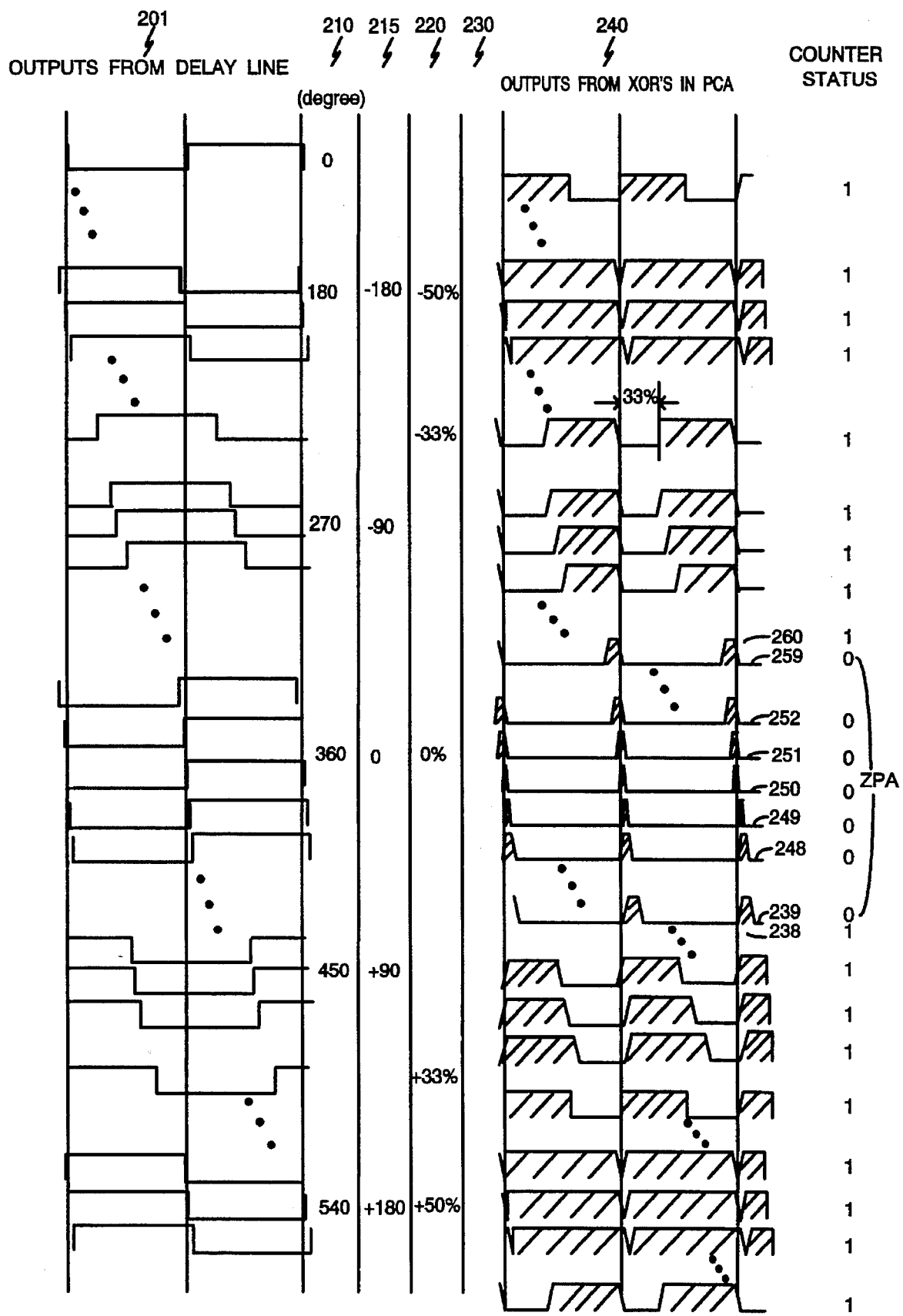
FIG. 3 is a timing diagram illustrating the phase-shifted reference clock from the outputs of different unit delay stages of the delay line, and the resulted signal waveform from the outputs of the XOR gates of the phase comparator array.

With reference to FIG. 3, the timing diagrams illustrate the delta phase window formation process. The column of output waveforms 201 are illustrative of the waveform output from the delay lines, each of which is delayed or phase shifted from the preceding one by the amount of the unit delay. Column 210 shows the phase difference of the corresponding waveforms in respect to the reference clock LCLK. Noting that at 360 degree phase shift, the waveform exactly coincides with LCLK. In column 215, delta phase difference for the corresponding delayed waveforms in each stage in respect to the waveform which has a 360 degree phase difference with LCLK is shown in degrees. Column 220, shows the delta phase in percentage. The output waveforms from each taped stage of the delay line between BADDR and EADDR are phase compared with LCLK by the XOR gates in the PCA 21. The resulting waveforms of this logic function shown in the group of waveform near 250 stays low. Near the average the waveforms have the minimum pulse energy. Going either directions, the pulse is widen by a step wider than the pulse of 250. For high speed data rate operations, this step or the unit delay should be very small—less than a few hundred picoseconds. The output pulse width from the stages in the neighborhood of ZPA 250 will not be well defined due to noise, temperature or supply voltage fluctuations, making the distinction of the minimum pulse width or the zero phase difference location difficult.

Instead of identifying the unique location where the minimum energy pulse 250 results, we employ the concept of "delta phase window". This is a window region or a group of waveforms and we determine its center and assume that the center is the zero phase location. In FIG. 2, the outputs from the XOR's of the PCA 21 are used as trigger signals for the counters in the delta phase window generator DPWG 31. Normally, counters require a minimum clock pulse width to be reliably triggered. In order to be safely triggered by very narrow pulses, high speed counters are required. In this scheme, however, the counters used in DPWG 31 do not require high sensitivity to the triggered signals having a pre-defined minimum clock pulse width nor does the clock pulse width need to be constant or stable over all operation conditions. This is due to the fact that the width of pulses generated by an XOR's from the stages in the neighborhood of the zero phase address on both sides of zero are incremented in the same step size and are symmetrical. In one instance, if the pulse width at 259, FIG. 3 just meets the minimum pulse width requirement of the counter then the pulse at 239 will do so also. Then, the pulse width from the stages above 259 and below 239 will all meet the minimum pulse width requirement to be able to trigger the counter, while the pulse width from the stages between 239 and 259 do not meet the minimum pulse requirement and are not able to trigger the counter. The status of a k-bit counter is defined as a "1" or as "full" if the counter has been triggered $2^{}k$ times and all the outputs are "1", after initial reset of zero. The status of a k-bit counter is defined as a "0" if it is not full. The counters clocked by the pulses corresponding to waveform 239 through 259 will not be triggered because of their inadequate pulse width, resulted in a "zero zone" of the counter status, or the so-called "delta phase window" region as mentioned before. The "width" of the delta phase window or the number of stages in this "zero zone" relates to the triggering sensitivity of the counter and to the pulse width of the trigger signal. The trigger signal width is related to the delay of the unit delay cells as well as to the speed of the XOR's and is subject to processing variations and changes in operating conditions. However, the differential or center of this "zero zone" is insensitive to all these conditions. The counters should not be too sensitive, i.e., trigger level pulse width must be no less than the time of several unit delays. Ideally, waveforms from the XOR's in PCA 21 are all well defined as shown in FIG. 3 and the counters in DPWG 31** could be reduced to 1-bit or simply to a T flip-flop.

In practice, environmental changes and electrical noises are expected, causing fluctuations in unit delays and timing or amplitude jittering on the signal lines. The waveforms 240 in FIG. 3, especially those in or near the "zero zone", may not be as ideal as depicted in the Figure. These stages may have indeterminate states due to: (1) the generated window pattern contains "noise", such as an "0" within the non-zero zone on the lower address side of the window; (2) counters not belonging to the zero zone miss some counts; (3) wrong ZPAG data being generated. Various noise rejection schemes can be employed to reduce the noise conditions.

The noise condition 1) can be filtered out by using an increased number of k bits (k>1) for the counter, such that random triggering may increment a few counts, but will not make the counter full. The noise condition 2) can be avoided by choosing a proper "wait" states number m (m>k) to wait for more than k=clock cycles before reading the counter status such that few missing counts will not affect the full status of the counters outside of the window region. In the event that a faulty window low address (DPWLA) is generated, when the data in DPWD 41 are left-shifted to detect the 1→0 transition, an isolated "0" within "1" will cause a 0→1 transition detected immediately after the 1→0 transition. This switching could be used as a noise status indicator in the zero phase address detection control block (ZPADC) 91 such that the fault detection precludes issuance of a new ZPAG data 83. Finally, even if faulty ZPAG data are generated 4), an integrator/filter can be included for the update control (UPDC) function 101 which compares the new ZPAG value in TAREG 75 with the old value in TBREG 76, and updates the output ZPA in ZPAREG 78 only if the two ZPAG values are consistent for a preset number of cycles.

Figure 4:
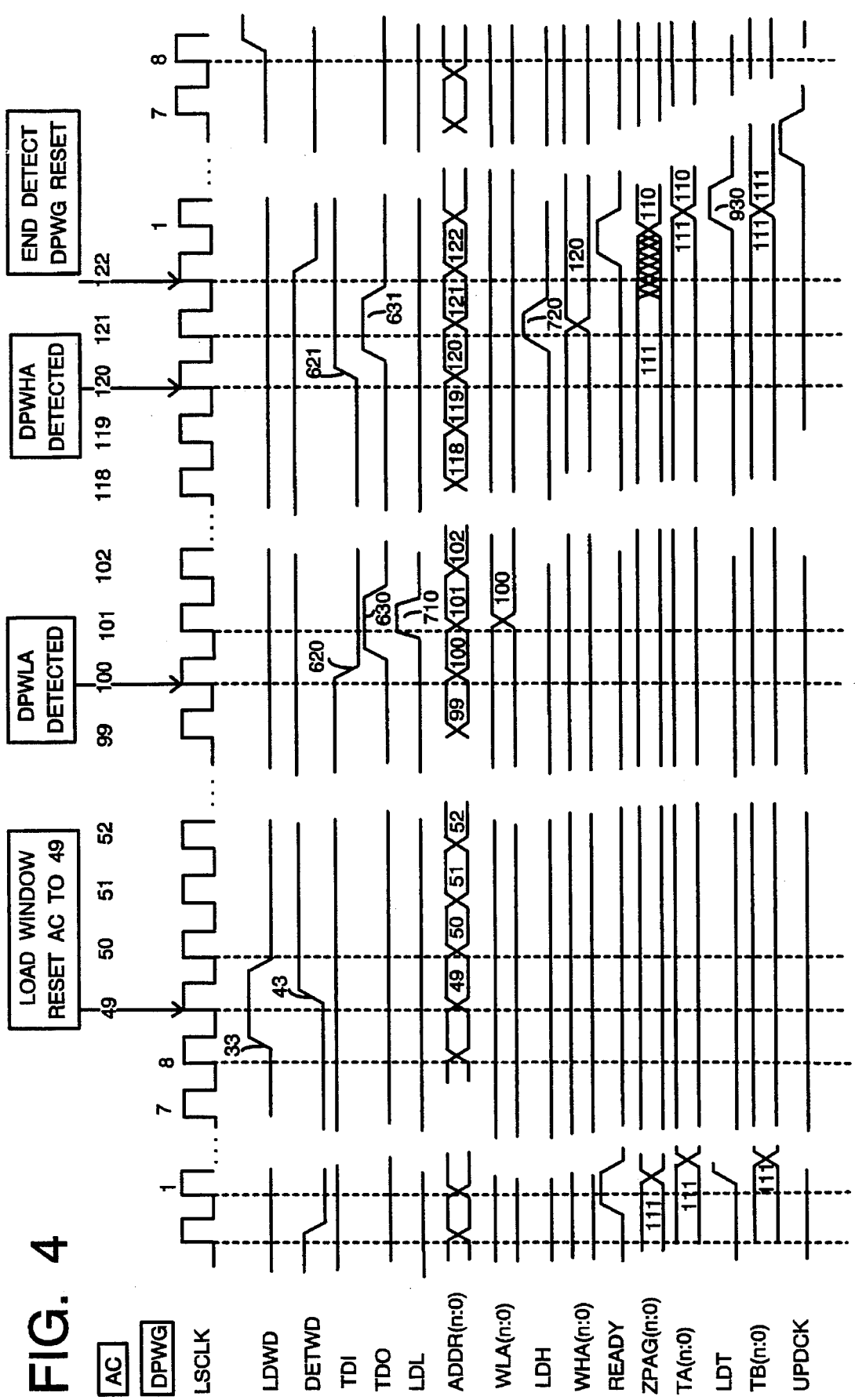
FIG. 4 is the timing diagram illustrating the zero phase address detection process.

FIG. 4 provides the timing diagram for the entire zero phase address (ZPA) detection apparatus and process. The reference clock LCLK 10 is the system clock. After going through a reset procedure, the counters in DPWG 31 are all reset to zero. All the DPWG outputs are then zeros and an output pattern of "0000 . . . 000 . . 000" results. For each LCLK, pulses with different width for each window address are generated from the XOR's and are used to clock the counters. At the end of an arbitrarily selected m-th LCLK cycle, the "window" pattern, i.e., the counter status data in DPWG 31, is parallel-loaded into the delta phase window detection block (DPWD) 41 by the load window command LDWD 33. The LDWD 33 is provided by DPWG 31 to also reset the address counter AC 51 to the beginning address value (BADDR) of the detection region. A rising edge of the "detection window" command DETWD 43 starts the left shifting of the window pattern to the transition detect (TD) 61. The address counter AC counts the LCLK synchronously. When the DPWD SEROUT signal goes 1→0, transition 620 is detected in transition detector 61 and a pulse 630 is provided at TDO 63, which signals the ZPA detection control (ZPADC) 91 to send a load command pulse LDL 710 to latch the content (100 in the example) of the address counter (AC) 51, that is the address for the left-side end of the zero zone of the "window" into window low address register WLAREG 71. The window data pattern is continued to be left-shifted every LCLK until the 0→1 transition 621 is detected, for which a pulse 631 at TDO is generated. This time, the ZPADC will send a command pulse 720 at LDH to latch the address value (120) of the right-side end of the window into the window high address register (WHAREG) 72. A cycle later, the output of the full adder in ZPAGEN 81, which has added the address in WLAREG and WHAREG and divided the sum by two, provides an output ZPA value of 110 which is valid and is latched into TAREG 75 by the command pulse 930 at LDT. At the same time the ZPA data which was in TAREG (TA(n:0)) is moved to TBREG 76. In this example, since TB(n:0) was 111 before the load command, there is no change in value. After a subsequent validity check by the update control UPDC 101 which provides a digital low pass filter function to ensure that the new ZPA value is not faulty due to noise, an update command pulse 103 at UPDZPA (not shown in this timing diagram) is issued and the ZPA value of 110 becomes available at the ZPA output. Note that the window sampling or the new ZPAG number generation take place only every S clock cycles where S is the sum of the waiting cycles while the counters in DPWG is counting (8 in this example), and the cycles when the window pattern is shifting in DPWD or (equals to ZPWHA−BADDR, or 120−49=71 in this example). "High frequency" noise or fast, temporary fluctuations are ignored or averaged inherently by this detection mechanism.

Figure 5:
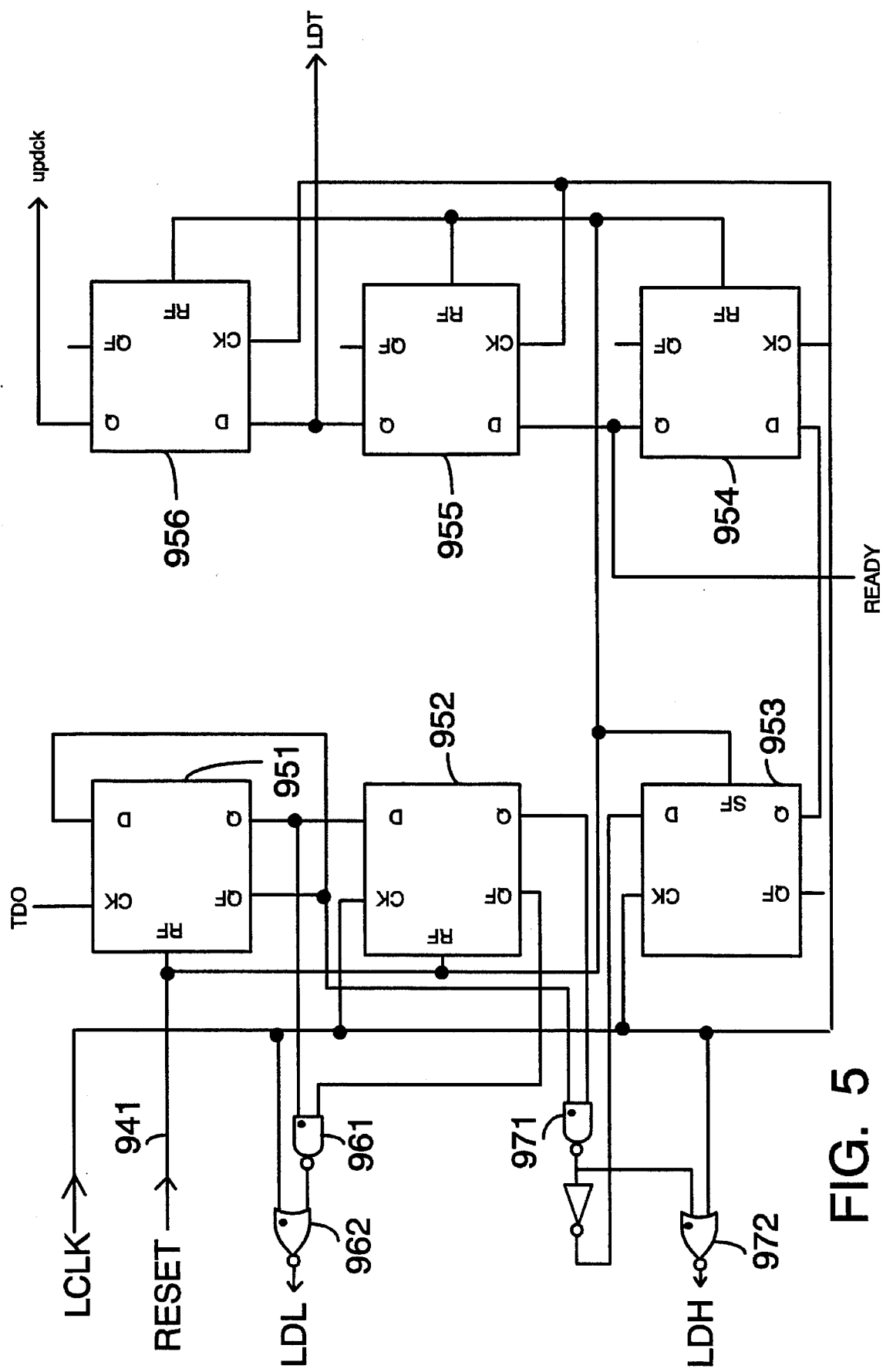
FIG. 5 shows a logic implementation of the zero phase address detection control block.

FIG. 5 shows an implementation example of the zero phase address detection control (ZPADC) block. After initial reset, the first pulse from TDO sets flip-flop 951 and the NAND gate 961 becomes low to enable the NOR gate 962. The following LCLK-low get to pass and produce a pulse at the LDL to load the WLAREG. The rising edge of the LCLK sets flip-flop 952 so one input of the NAND gate 971 becomes high while the other input remains low until the following pulse in TDO (when window high address is detected) resets flip-flop 951. NAND gate 971 is then output a "0" which subsequently enables the NOR gate 972 to produce a pulse when the following LCLK low arrives. This is the command signal LDH which loads WHAREG. The next two LCLK cycles are used to ensure that the ZPA data are ready at ZPAGEN 81 and the delta phase window detection process has been ended. A READY Signal at the output of flip-flop 954 goes high and resets the counters in DPWG for the next-run window detection, as well as to signal the DPWD to end shifting. (FIG. 1) A cycle late, a load temporary register signal (LDT) is generated at the output of flip-flop 955, followed by an update clock UPDCK from 956. A clear or reset signal at 941 from the STARTUP block resets all the flip-flops and make it ready for another ZPA detection cycle.

Figure 6:
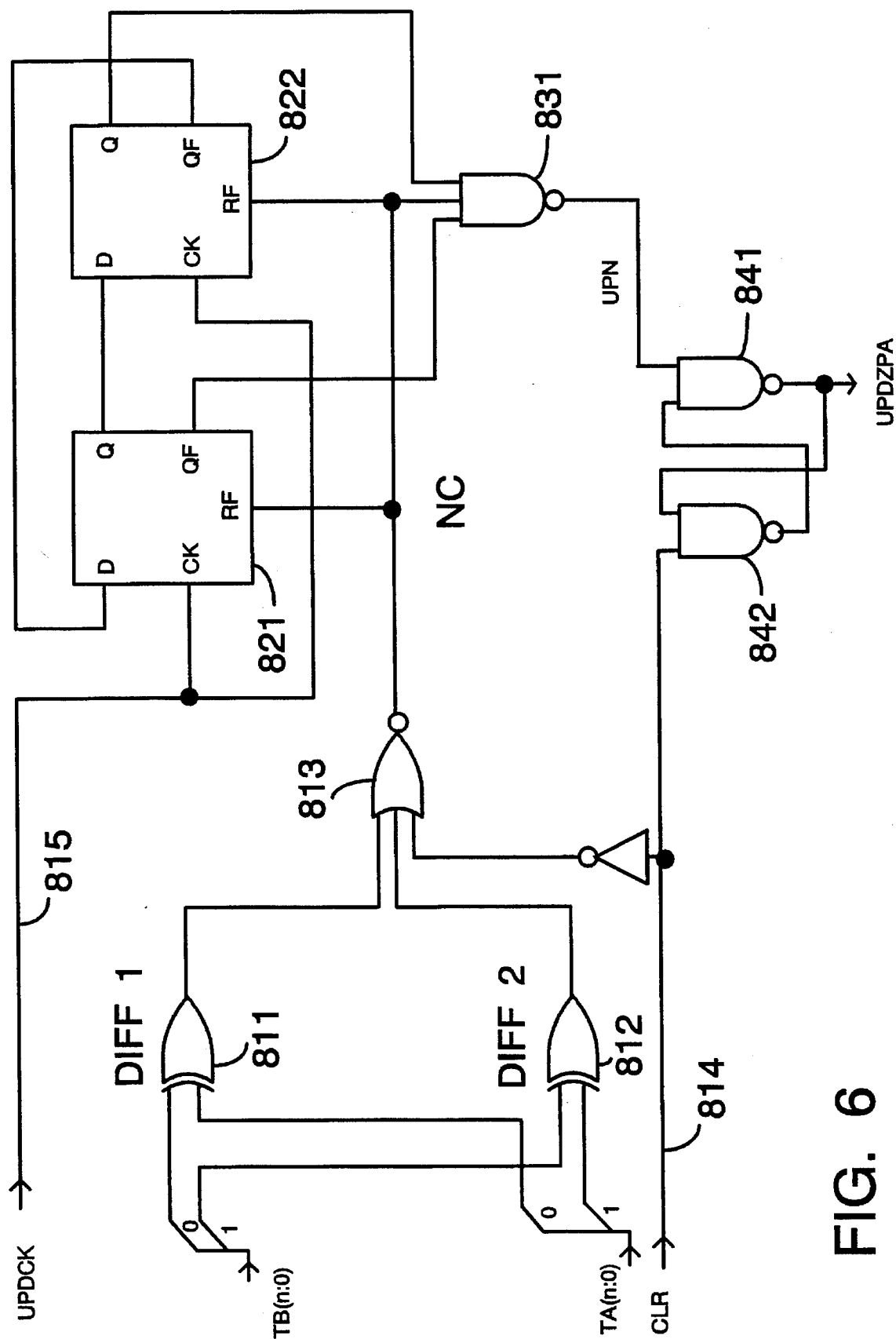
FIG. 6 is a particular implementation of the update control logic.

FIG. 6 is a schematic of the update control block 101. An active low CLR signal on line 814 resets D flip-flop (DFF) 821 and 822. It also resets the RS latch formed by NAND gate 841 and 842, and output UPDZPR becomes "0". After reset, line 814 returns to "1", so both NOR gate 813 and NAND gate 842 are enabled. XOR 811 and 812 compare the LSB (least-significant-bit) and the next-to-LSB bit of TA(n:0) and TB(n:0) from TAREG 75 and TBREG 74 respectively. TA (n:0) and TB(n:0) represent two consecutive detected ZPAs. If they are not the same, output DIFF1 and/or DIFF2 will be a "1" to make NC a "0". This will prevent NOR gate 831 output UPN from being a "0" and UPDZPR will not change states, so that no update action occurs. When TA(n:0) and TB(n:0) are the same, both DIFF1 and DIFF2 will be "0" so NC becomes "1" to release DFF 821, and 822 and NAND gate 831. The UPDCK 815 clocks the DFFs until "01" states are reached when all inputs to NAND gate 831 are "1" and UPN becomes "0", which sets the 841/842 RS latch and a rising transition of UPDZPR is generated. Note that this happens only if TA(n:0) and TB(n:0) stays the same for a number of cycles (in this case, it is 3 cycles) then a rising edge of UPDZPR can be produced. Whenever TA(n:0) and TB(n:0) become different, output of NOR gate 813, i.e. node NC becomes "0" to reset the two DFFs. With this control, the output ZPAREG will not be changed upon a temporary change in detected ZPA. As a result, this update control serves to filters out the temporary fluctuations on the ZPA.

From the above, it is apparent that the invention provides a novel and advantageous apparatus and method for calibration of a digital delay line and for providing an accurate and precise reference for digital phase shifting applications which are compensated for varying process and temperature parameters.

Accordingly, the disclosures of preferred apparatus and methods are not intended to be limiting but rather the scope of the invention should be determined by the claims.

What is claimed is:

1. A circuit in a semiconductor integrated circuit for providing a signal which is accurately representative of propagation delay in circuits in said integrated circuit comprising:

an input terminal, said input terminal for receiving a clock reference signal;

a serially connected chain of unit delay cells including a first unit delay cell, said first unit delay cell being connected to said input terminal to launch said clock reference signal for propagation down said chain of unit delay cells, each cell having an input and output;

a plurality of taps, each tap being connected to a said unit delay cell, said tap providing a signal representative of said unit delay cell output;

a phase comparator array, said phase comparator array including a plurality of logic gates, where each said tap has a logic gate corresponding to said tap, and each said corresponding logic gate having a first input connected to said input terminal for receiving said clock reference and a second input connected to said corresponding tap, each said logic gate having an output signal;

circuit means to periodically simultaneously sample and hold a binary representation of the output value of each said output signal of each said logic gate output, wherein said sample and hold circuit means has substantially identical threshold response to falling signals and to rising signals so that a threshold change which lowers the sensitivity to a transition of said output signal of a said logic gate from a one to a zero will have a matching decrease in the sensitivity to a transition of said output signal of a said logic gate from a zero to a one so that the time of occurrence of the midpoint between a falling/rising signal transition time and the next rising/failing signal transition time is substantially unchanged as a function of threshold changes;

means to analyze said output signals of each said logic gate to determine the address of the tap where said logic gate output goes from 1 to 0 being the window low address, and the address of said tap where said logic gate output goes from 0 to 1 being the window high address; and means to determine the address of the tap at which the phase of said propagating clock reference signal, in operation, is closest to being exactly in phase with said clock reference signal applied to said input terminal, said tap being called the zero tap, said means to determine the address of said zero tap being coupled to said means to analyze said output signals of each said logic gate, said means to determine the address of said zero tap including means for providing an output signal representative of said address of said zero phase tap which said output signals is accurately representative of propagation delay in circuits in said integrated circuit.

2. The apparatus of claim 1 wherein said logic gates are a plurality of XOR circuits having transient output pulses which have energy, and wherein said energy in the output pulses of the XOR circuits having addresses between said window low address and said window high address are too low to cause said sample and hold circuits to register a one state.

3. The apparatus of claim 2 wherein said means to analyze said logic gate output signals includes:

means for periodically updating said address of said zero tap, and further including means to confirm that said zero tap address is consistent with an arbitrary number of previous computations of said zero tap address.

4. The apparatus of claim 3 wherein said means to analyze said logic gate output signals includes:

means for shifting serially:

a counter, said counter being connected to a clock signal;

means for parallel loading said sampled and held XOR outputs into said means for shifting serially:

a transition detector, said transition detector being connected to said means for shifting, in operation, said transition detector provides an output indication of the occurrence of transitions 0 to 1 and 1 to 0; and means responsive to said transition detector output signals for reading said counter to provide said window low address and said window high address.

5. The apparatus of claim 2 wherein said means to periodically simultaneously sample and hold the output signal of said logic gate circuits includes, a plurality of counter means, said counter means including a plurality of flip-flop circuits connected as a binary up counter, each said counter having an input and an output, said counter input being connected to one said XOR output.

6. The apparatus of claim 5 wherein the number of flip-flops in said counter is large enough to provide a filtering so that a few noise triggers will not fill the counter.

* * * * *